(12) United States Patent
Sakiyama et al.

(10) Patent No.: US 7,675,387 B2
(45) Date of Patent: Mar. 9, 2010

(54) SURFACE ACOUSTIC WAVE DEVICE AND COMMUNICATION TERMINAL USING THE SAME

(75) Inventors: Kazuyuki Sakiyama, Chigasaki (JP); Kengo Asai, Hachiouji (JP); Atsushi Isobe, Kodaira (JP); Kunio Matsumoto, Koshigaya (JP); Shinichi Fujiwara, Kamakura (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 366 days.

(21) Appl. No.: 11/514,229

(22) Filed: Sep. 1, 2006

(65) Prior Publication Data

US 2007/0120623 A1    May 31, 2007

(30) Foreign Application Priority Data

Nov. 30, 2005    (JP) .............................. 2005-344870

(51) Int. Cl.
*H01L 41/00* (2006.01)
(52) U.S. Cl. ..................................... 333/133
(58) Field of Classification Search ......... 333/193–196, 333/133
See application file for complete search history.

(56) References Cited

U.S. PATENT DOCUMENTS

| | | | |
|---|---|---|---|
| 2001/0040487 A1* | 11/2001 | Ikata et al. | 333/133 |
| 2002/0149295 A1 | 10/2002 | Onishi et al. | |
| 2003/0001696 A1* | 1/2003 | Yoshida et al. | 333/193 |
| 2004/0135650 A1 | 7/2004 | Miura et al. | |
| 2004/0226162 A1* | 11/2004 | Miura et al. | 29/594 |

FOREIGN PATENT DOCUMENTS

JP    2005-229455    8/2005

* cited by examiner

*Primary Examiner*—Rexford N Barnie
*Assistant Examiner*—Thienvu V Tran
(74) *Attorney, Agent, or Firm*—Antonelli, Terry, Stout & Kraus, LLP.

(57) ABSTRACT

A surface acoustic wave device in the present invention is provided with a piezoelectric substrate, a supporting substrate being jointed to the piezoelectric substrate and including a material different in expansion coefficient from the piezoelectric substrate and an interdigital electrode for exciting a surface acoustic wave, the electrode being arranged on the surface of the piezoelectric substrate. Either the interdigital electrode or the piezoelectric substrate is configured so that the interdigital electrode is 40% or more to 70% or less as long as the piezoelectric substrate in the direction to which a surface acoustic wave propagates.

23 Claims, 5 Drawing Sheets

SURFACE ACOUSTIC WAVE DEVICE AND COMMUNICATION TERMINAL USING THE SAME

CLAIM OF PRIORITY

The present invention claims priority from Japanese application JP 2005-344870 filed on Nov. 30, 2005, the content of which is hereby incorporated by reference into this application.

BACKGROUND OF THE INVENTION

The present invention relates to a surface acoustic wave device and a communication terminal using the same.

Hitherto, a Japanese Patent Laid-Open No. 2005-229455 has proposed "a surface acoustic wave device whose piezoelectric substrate is 5 μm to 100 μm thick, joint surface is roughly polished, and supporting substrate consists of silicon of which both surface layers are oxidized to be 0.1 μm to 40 μm thick" as a surface acoustic wave device "formed from a piezoelectric substrate and a supporting substrate smaller in expansion coefficient than the piezoelectric substrate, both substrates being bonded together with an adhesive layer."

SUMMARY OF THE INVENTION

In the Japanese Patent Laid-Open No. 2005-229455, the surface acoustic wave device is configured in such a manner that materials different in expansion coefficient from each other are used for the piezoelectric and the supporting substrate to mutually suppress the deformation of both substrates caused by change in temperature, thereby stabilizing a frequency temperature characteristic.

However, the Japanese Patent Laid-Open No. 2005-229455 discloses nothing about the arrangement of interdigital electrodes in the surface acoustic wave device. In other words, the Japanese Patent Laid-Open No. 2005-229455 discloses only the structure of layer of the surface acoustic wave device, but nothing about that of surface, for example, how the interdigital electrodes are arranged at the surface.

For this reason, the art according to the Japanese Patent Laid-Open No. 2005-229455 can not achieve an effect of suppressing the deformation of the substrates caused by change in temperature depending on the arrangement of the interdigital electrodes. That is to say, the end face of the surface acoustic wave device is a free end, which does not enable suppressing the deformation of the substrate caused by change in temperature. Even in an area near the end face the interdigital electrode suppresses less effectively the deformation not to provide a desired frequency temperature characteristic.

The document does not reveal an area where an effect of suppressing deformation of the substrate is achieved in the surface acoustic wave device, so that it is unclear where the interdigital electrode is arranged and the desired frequency temperature characteristic cannot be obtained either.

In order to achieve the above purpose, in one aspect, the present invention includes a piezoelectric substrate, a supporting substrate being joined to the piezoelectric substrate and made of a material different in expansion coefficient from the piezoelectric substrate, and an interdigital electrode arranged on the surface of the piezoelectric substrate to excite a surface acoustic wave. The interdigital electrode is 40% or more to 70% or less as long as the piezoelectric substrate in the direction to which a surface acoustic wave device propagates.

According to the aspect of the present invention, there can be provided a surface acoustic wave device excellent in temperature and a communication terminal using the same.

BRIEF DESCRIPTION OF THE SEVERAL VIEWS OF THE DRAWING

Embodiments of the present invention will be described in detail based on the following figures, wherein.

DESCRIPTION OF THE PREFERRED EMBODIMENTS

The following is a description of the background and in particular of the frequency temperature characteristic of surface acoustic wave device according to the present embodiments of the present invention.

A surface acoustic wave device is provided with a piezoelectric substrate on which interdigital electrodes are arranged and a supporting substrate for supporting the piezoelectric substrate.

In general, the piezoelectric substrate directly uses a single crystal substrate of lithium tantalite (hereinafter abbreviated as LT), lithium niobate (hereinafter abbreviated as LN) or crystal as a single crystal substrate for the surface acoustic wave device. Particularly a surface acoustic wave propagates faster on the LT and the LN single crystal substrate, and both the substrates have a larger electromechanical coupling coefficient, so that they are widely used as the substrate of a surface acoustic wave device for higher and broader band frequencies.

However, the substrates vary largely in propagation velocity with temperature, or in Temperature Coefficient of Delay (hereinafter abbreviated as TCD). This makes it difficult to adjust the center frequency of a filter determined by the space between the electrodes of the interdigital electrode and the acoustic velocity of the elastic wave in order for the center frequency not to change with temperature. In particular, if an interval is shorter between a passband frequency and stop band frequency, the temperature coefficient significantly influences a propagation velocity. Solutions to this problem have been proposed in which a silicon oxide film with a reverse temperature coefficient is formed on a piezoelectric substrate on which an interdigital electrode for transmitting and receiving a surface acoustic wave is provided or a piezoelectric substrate is joined directly or with adhesive to a substrate made of sapphire or silicon (hereinafter abbreviated as Si) smaller in thermal expansion coefficient.

However, the above solutions have the following problem. The one solution, in which a silicon oxide film with a reverse temperature coefficient is formed on a piezoelectric substrate on which an interdigital electrode is provided, makes it very difficult to control the thickness of the film to be formed. This is because an excessively thick film causes the whole frequency characteristic to move to lower frequencies, and an excessively thin film, on the other hand, causes the frequency characteristic to move to higher frequencies, resultantly, the variation of film thickness directly leads to the variation of frequency. Moreover, expensive facilities are required to improve the accuracy of thickness of the film to be formed.

The other solution, in which a piezoelectric substrate is joined directly to a substrate smaller in thermal expansion coefficient, requires a very high flatness on both substrate surfaces to be joined, a very high cleanliness on both sides to be joined, as well as a complete removal of bubbles between the substrates. This also requires expensive facilities suited to the above.

Even though these problems are resolved by devising the layer construction of the surface acoustic wave device, an effect of suppressing the deformation of the substrates caused by change in temperature cannot be achieved depending on the arrangement of the interdigital electrodes, which does not provide a desired frequency temperature characteristic. It has not been disclosed that an area where an effect of suppressing deformation of the substrate is achieved in the surface acoustic wave device, so that it is unclear where the interdigital electrode should be arranged, and the desired frequency temperature characteristic cannot be obtained either.

As described above, considerations need to be taken into account as to the surface structure, that is, how the interdigital electrodes are arranged on the surface, as well as the layer structure of the surface acoustic wave device to obtain the desired frequency temperature characteristic.

The embodiment of the present invention is described below with reference to the drawings.

Figure 1:
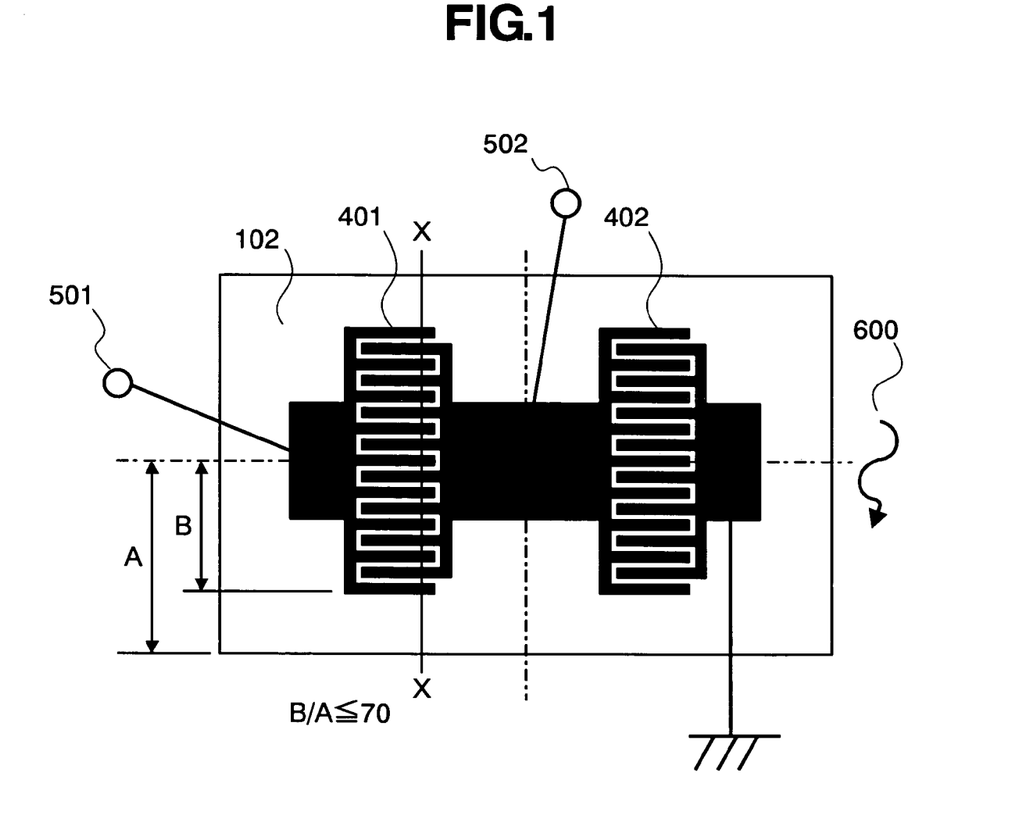
FIG. 1 is a top view of a surface acoustic wave device related to a first embodiment of the present invention.
Figure 2:
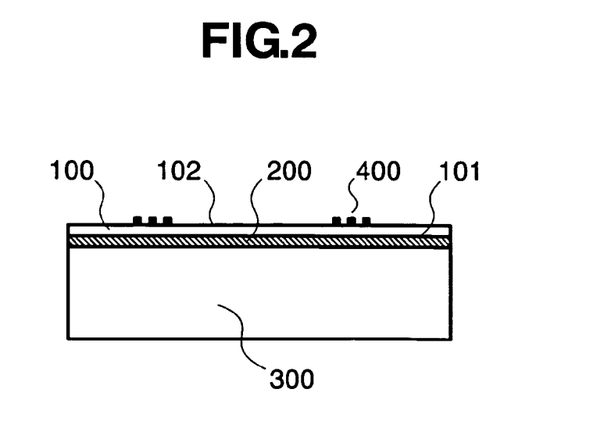
FIG. 2 is a cross section of the surface acoustic wave device related to the first embodiment.

FIG. 1 is a top view of a surface acoustic wave device and FIG. 2 is a cross section taken along line X-X of the surface acoustic wave device illustrated in FIG. 1. In FIGS. 1 and 2, reference numeral 100 denotes an LT substrate as single crystal piezoelectric substrate, 101 a joint surface, 102 a top surface or surface of the LT substrate, 200 an adhesive, 300 a Si substrate as a single crystal supporting substrate for supporting the piezoelectric substrate, 400 an interdigital electrode (hereinafter abbreviated as IDT electrode), 401 a series resonator made up of the IDT electrode, 402 a shunt resonator, 501 an input terminal for inputting a signal to the series resonator 401, 502 an output terminal for outputting a signal from the shunt resonator 402, and 600 a propagation direction of a surface acoustic wave.

As shown in FIG. 1, the series and the shunt resonator 401 and 402 made up of the IDT electrode 400 are arranged on the top surface 102 of the LT substrate. A signal is inputted into the input terminal 501 and the signal filtered by the above series and the shunt resonator is outputted through the output terminal 502. At this point, the surface acoustic wave 600 is excited perpendicularly to the IDT electrode and propagated as shown in the figure.

As shown in FIG. 2, the joint surface 100 of the LT substrate 100 is joined to the Si substrate 300 by the adhesive 200. The top surface 102 of the LT substrate is so-called "mirror polished," that is, 0.1 nm<Ra<0.5 nm, where Ra is an index of roughness of the joint surface, on which the minute interdigital electrode 400 for transmitting and receiving a surface acoustic wave is formed.

The following describes a difference in configuration of layer structure between the present embodiment and the Japanese Patent Laid-Open No. 2005-229455. The present embodiment uses ultraviolet hardened epoxy adhesive in an adhesive for joining, whereas the Japanese Patent Laid-Open No. 2005-229455 uses a photocurable, but acryl adhesive. This is because the epoxy adhesive has a smaller variation in Young s modulus with change in temperature.

In the present embodiment, the joint surface of the single crystal piezoelectric substrate is mirror polished as described above, whereas, in the Japanese Patent Laid-Open No. 2005-229455, the joint surface is roughened in the range of 0.05 µm<Ra<0.3 µm, where Ra expresses roughness. This is because the joined substrate can be less bowed by mirror-finishing the joint surface opposite to the surface of the single crystal piezoelectric substrate on which the IDT electrode is mounted, because the surface of the single crystal piezoelectric substrate on which the IDT electrode is mounted is so-called mirror polished.

While in the present embodiment a high resistivity Si substrate with a resistivity of 100 Ωcm or higher is used as a base substrate, in the Japanese Patent Laid-Open No. 2005-229455 a Si substrate is used whose surface layer is oxidized to be 0.1 µm to 40 µm in thickness. This is because the high resistivity Si substrate is more available.

While in the present embodiment the LT substrate with an orientation of 30° to 45° Y-cut and LN substrate with an orientation of 40° to 65° Y-cut are used as the single crystal piezoelectric substrate, in the Japanese Patent Laid-Open No. 2005-229455 merely the LT and the LN substrate are used. This is because the LT and the LN substrate according to the present embodiment provide a surface acoustic wave faster in propagation velocity and larger in electromechanical coupling coefficient in the range specified in the present embodiment.

The following describes a difference in surface structure between the present embodiment and the Japanese Patent Laid-Open No. 2005-229455 using FIG. 1. In FIG. 1, reference character A denotes a distance between the center of the surface acoustic wave device and the end thereof and reference character B indicates a distance between the center of the surface acoustic wave device and the end of the surface acoustic wave resonator. Both distances A and B are based on the same direction to which a surface acoustic wave propagates. In FIG. 1, the closer the distance B is to the distance A, that is to say, the larger the ratio of B/A, the weaker the suppressing effect of a thermal expansion coefficient of the LT substrate by the Si substrate, which reduces the suppressing rate of TCD in the surface acoustic wave device. This seems to degrade the temperature characteristic. This is because the end face of the surface acoustic wave device is a free end, so that the deformation of the substrate caused by change in temperature cannot be offset or suppressed between the piezoelectric and the supporting substrate. Even in the area near the end face the suppressing effect is smaller on account of the same reason.

Accordingly it is preferable not to arrange the interdigital electrode when possible at the distal area of the surface acoustic wave device and the peripheral area thereof, in particular, at the end area in the direction to which a surface acoustic wave propagates and the peripheral area thereof. In other words, a stabler frequency temperature characteristic can be obtained according as the ratio of B/A becomes smaller.

Excessively widening the peripheral area to ensure a stable frequency temperature characteristic reduces a use efficiency of the substrate, which makes it difficult to down size the surface acoustic wave device and hinder a cost reduction because an additional substrate material is required. It should be therefore avoided to make the ratio of B/A excessively smaller, and it is desirable to determine the ratio of B/A within a necessary and sufficient range within which a frequency temperature characteristic can be ensured.

The above is described with reference to FIGS. 3, 4, 5, and 7.

Figure 3:
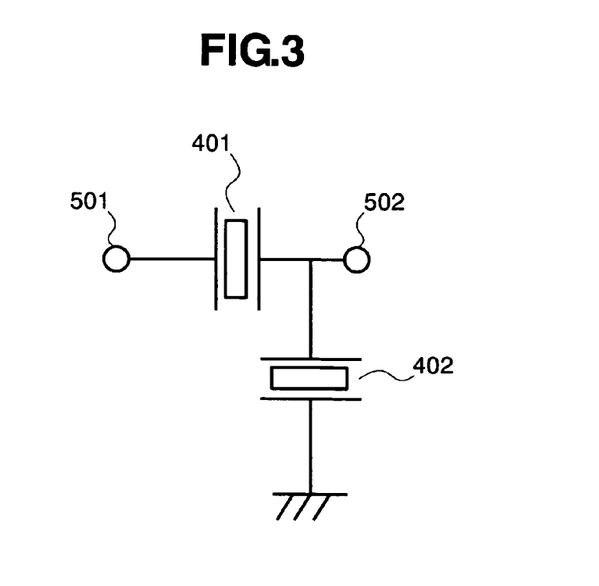
FIG. 3 is an equivalent circuit diagram of the surface acoustic wave device shown in FIG. 1.

FIG. 3 is an equivalent circuit diagram showing the configuration of the surface acoustic wave device in the present embodiment described in FIGS. 1 and 2. The interdigital electrodes 401 and 402 arranged on the surface of the surface acoustic wave device show the series and the shunt resonator respectively.

Figure 4:
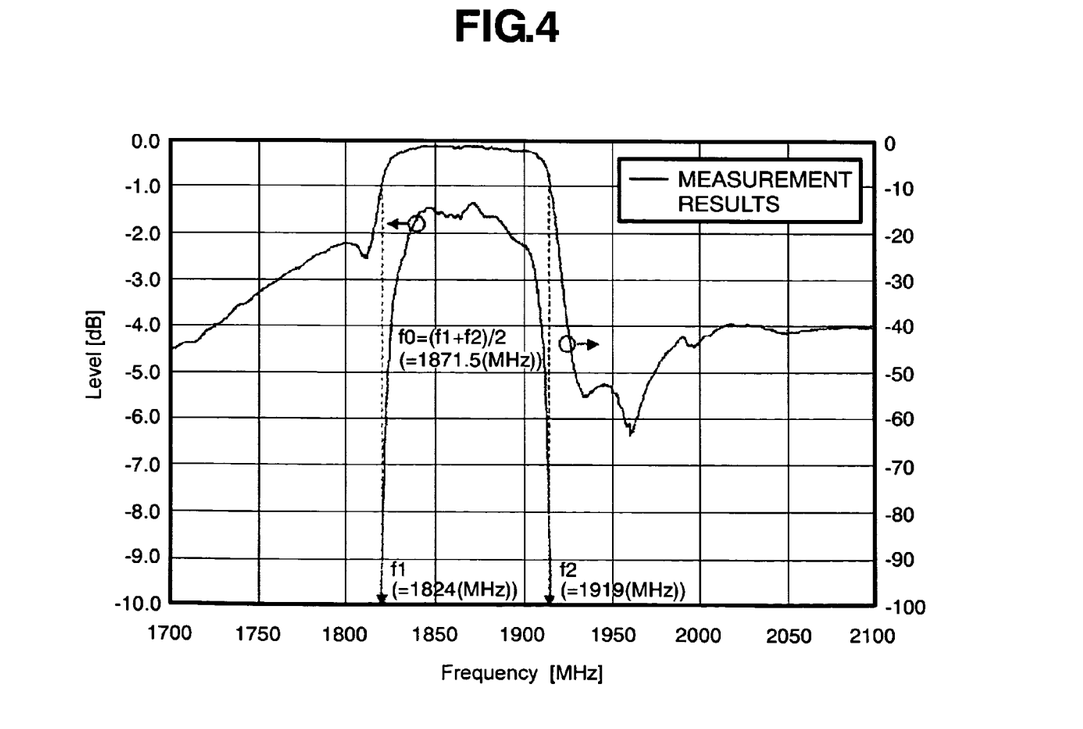
FIG. 4 is a frequency characteristic diagram obtained from the surface acoustic wave device shown in FIG. 1.

FIG. 4 shows a frequency characteristic obtained from the configuration shown in FIG. 3. In FIG. 4, the abscissa shows frequencies (Hz in unit) and the ordinate shows attenuation (dB in unit). If the left and right frequency at an attenuation of 10 dB are taken as f1 and f2 respectively, the center frequency is expressed by (f1+f2)/2. Here, frequencies used in a mobile communication terminal are taken as an example for explanation, the frequency f1 is 1824 MHz, the frequency f2 is 1919 MHz, and the center frequency is 1871.5 MHz.

Figure 7:
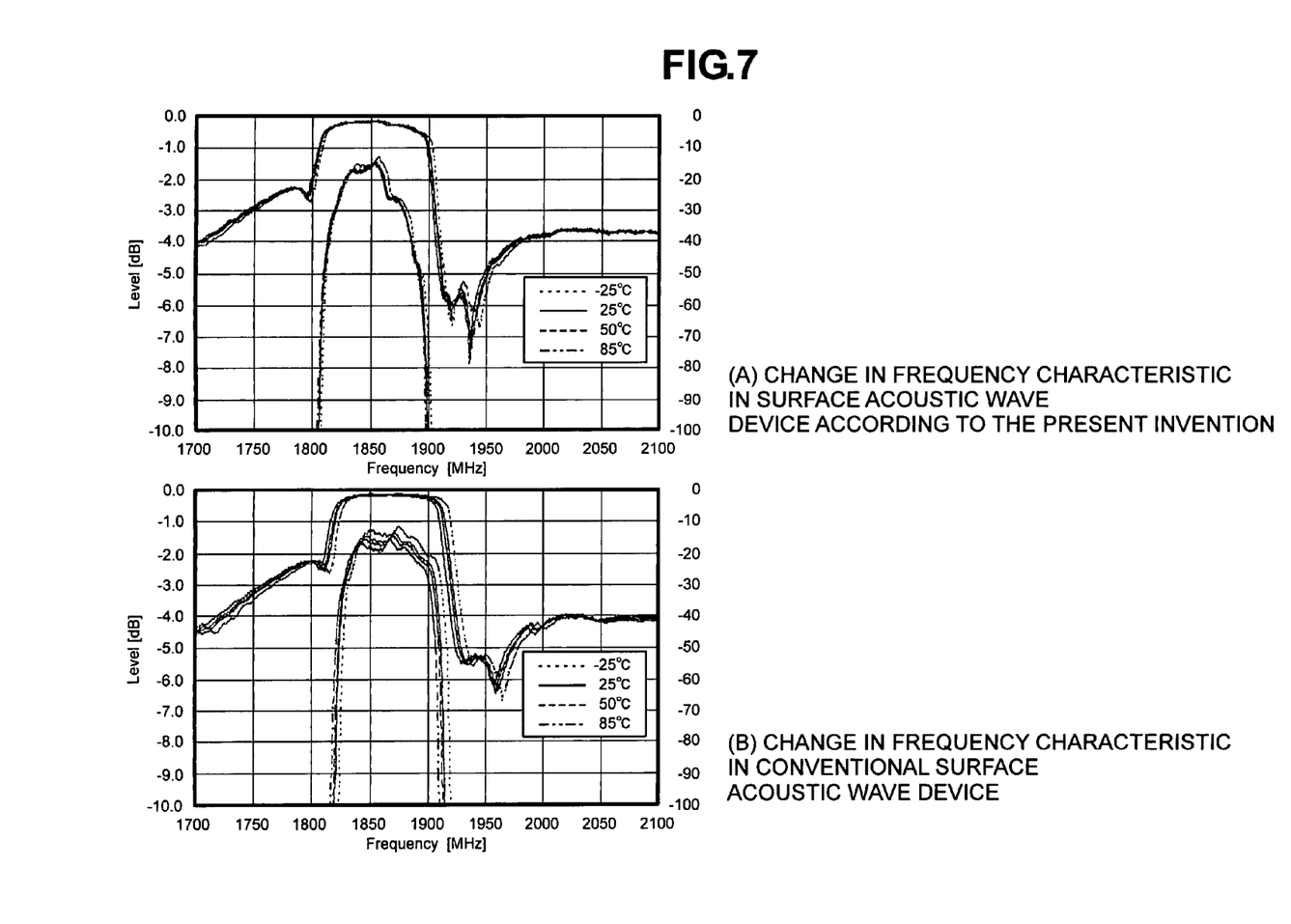
FIG. 7 shows frequency temperature characteristics according to the present embodiment and a conventional embodiment.

FIG. 7 (A) show the frequency temperature characteristic obtained when the present embodiment is applied and FIG. 7(B) shows a conventional frequency temperature characteristic. It can be seen from comparison with both figures that the deviation of frequency characteristic caused by change in temperature has been significantly improved in the present embodiment.

That is to say, FIG. 7 shows frequency temperature characteristics at −25° C., 25° C., 50° C., and 85° C. The characteristics in the present embodiment are smaller in variation with temperature than those in the conventional embodiment. The difference in peak loss is approximately 0.24 dB in the present embodiment, whereas that is approximately 0.43 dB in the conventional embodiment.

Figure 5:
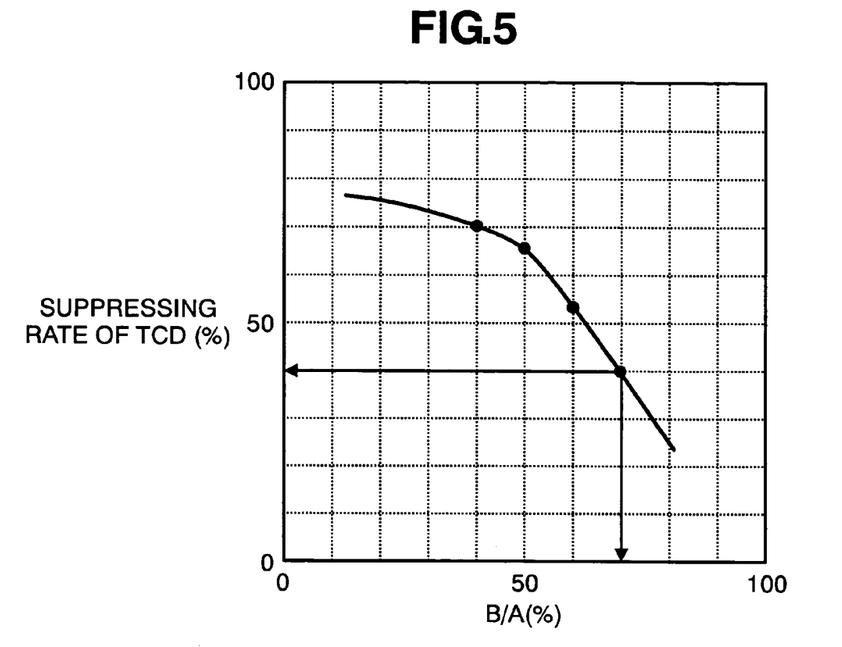
FIG. 5 is a chart showing the variation of temperature suppressing rate as a function of the ratio of a distance from the center of the surface acoustic wave device to the end of a surface acoustic wave resonator to a distance from the center of the surface acoustic wave device to the end thereof.

FIG. 5 shows a chart showing a suppression rate of TCD obtained from measuring a temperature characteristic of the center frequency with the LT substrate actually joined to the Si substrate and with the length of the surface acoustic wave device changed. In the figure, the abscissa shows the above-mentioned ratio of B/A and the ordinate shows the suppression rate of TCD. According to the figure, the smaller the ratio of B/A, the larger the TCD, which provides the surface acoustic wave device excellent in temperature characteristic. It can be seen from the results in FIG. 5 that the suppression rate of TCD is approximately 25% at the ratio of B/A of 80%, that of TCD is approximately 40% at the ratio of B/A of 70%, that of TCD is approximately 55% at the ratio of B/A of 60%, that of TCD is approximately 65% at the ratio of B/A of 50%, that of TCD is approximately 70% at the ratio of B/A of 40%, and that of TCD is approximately 75% at the ratio of B/A of 30%.

As can be seen from the figure, the suppression rates of TCD cannot be increased so much in the range with a ratio B/A of about 80%. The suppression rates of TCD are improved in the range with a ratio of B/A of 70% or less and sharply improved until the ratio of B/A reaches the range of about 40%. The suppression rates of TCD are not increased so much at the ratio of B/A of 40% or less. Therefore, the ratio of B/A should be 70% or less to relatively sufficiently improve TCD. On the other hand, it is desirable that the ratio of B/A be 40% or more to ensure the use efficiency and downsizing of the substrate. It cannot be expected so much that the suppression rates of TCD are improved at the range with the ratio of B/A of 40% or less. From the above reason, it is desirable that the ratio of B/A be 40% or more to 70% or less in consideration of compatibility between the suppression of TCD and the use efficiency of the substrate. It is conceivable that the ratio of B/A is 50% or more to 60% or less if the suppression rates of TCD are further increased with the use efficiency of the substrate maintained to some extent. The ratio of B/A may range from 60% or more to 70% or less if the suppression rate is prioritized.

The TCD suppression effect becomes more remarkable in a system in which a frequency interval is narrow between the reception band frequency and transmission band frequency and attenuation is obliged to be increased at band frequency of the other party. That is to say, the surface acoustic wave device for reception is required to have a smaller attenuation at a reception band frequency and a larger attenuation at a transmission band frequency. In the surface acoustic wave device for transmission, on the other hand, the TCD suppression effect becomes especially effective in a system required to have a smaller attenuation at a transmission band frequency and a larger attenuation at a reception band frequency.

In a mobile terminal, a Code Division Multiple Access system (hereinafter abbreviated as CDMA system) has become popular rapidly in recent years. The frequency arrangement of a CDMA system among others which is mainly served particularly in North America is described below. The above CDMA system is required to operate simultaneously a transmission and a reception system while a telephone call is in progress and to keep a good speech quality. For this reason, the surface acoustic wave device used for the transmission system is required to have a smaller attenuation at the transmission band frequency and a larger attenuation at the other party, that is, at the reception band frequency. On the other hand, the surface acoustic wave device used for the reception system is required to have a smaller attenuation at the reception band frequency and a larger attenuation at the other party, that is, at the transmission band frequency.

The above CDMA system mainly served in North America has transmission band frequencies of 1850 MHz to 1910 MHz and reception band frequencies of 1930 MHz to 1990 MHz. An interval is as narrow as 20 MHz between the transmission and the reception band frequency. On the other hand, in the surface acoustic wave device, the sum of a frequency band required for tilting from a passband frequency to an attenuation band frequency, a frequency band due to change in material or process at the time of manufacturing a surface acoustic wave device, and a frequency band varying with temperature needs falling within the interval between the above transmission and the reception band frequency. In the above CDMA system served mainly in North America, the frequency band required for tilting from a passband frequency to an attenuation band frequency is approximately 10 MHz and the frequency band due to change in material or process at the time of manufacturing a surface acoustic wave device is substantially 5 MHz, so that the frequency band varying with temperature is provided with approximately 5 MHz.

On the other hand, in the LT substrate used for the surface acoustic wave device, an LT single crystal is 30° to 45° Y-cut in orientation, and in most LT single crystals the surface acoustic wave propagates to the X-axis direction. Out of the above orientations, an LT single crystal wafer with an orientation of around 42° Y-cut is described below. The above wafer is approximately −42 ppm/° K. in TCD. If the usable temperature range of a mobile terminal is taken as −25° C. to 85° C. and a surface acoustic wave device based on the CDMA system served mainly in North America is formed using the above wafer, the frequency band varying with temperature is nearly 8.8 MHz, which does not fall within 5 MHz in the total temperature range. This cannot satisfy the frequency characteristic.

On the other hand, setting the ratio of B/A at 70% or less based on FIG. 5 according to the present invention can provide a suppression rate of TCD of 40% or more thereby to suppress the frequency band varying with temperature to approximately 5 MHz, which can provide a stable frequency characteristic. The smaller the ratio of B/A is, the higher the effect becomes. From considerations of efficiency of the surface acoustic wave device obtained from one single crystal piezoelectric substrate, it is not expedient to infinitely minimize the device. Furthermore, even if the ratio of B/A is set at 20% or less based on FIG. 5 according to the present invention, the effect scarcely changes. Consequently, it is preferable to take the lower limit of the ratio of B/A to be 20%. Still furthermore, taking the ratio of B/A to be 60% or less can provide a suppression rate of TCD of 50% or more, which can moderate the frequency band required for tilting from a passband frequency to an attenuation band frequency and the frequency band varying with temperature and supply a surface acoustic wave device inexpensive and excellent in performance.

Even though the distance A is extremely enlarged and the distance B is also enlarged at the same time, a manufacturing efficiency of the surface acoustic wave device obtained from one single crystal piezoelectric substrate is decreased as stated above. For this reason, it is desirable to suppress the difference between A and B, i.e., "A−B" to 100 μm or less.

The LT single crystal wafer with an orientation of around 42° Y-cut has been described above, even an LT single crystal wafer with an orientation of around 39° Y-cut is capable of providing the same effect. The LT single crystal wafer with an orientation of around 39° Y-cut is approximately −35 ppm/° K. in TCD. In this case, the frequency band varying with temperature is nearly 7.3 MHz in the same temperature range as described above. Accordingly, setting the ratio of B/A to 75% or less can suppress the frequency band varying with temperature to approximately 5 MHz. Setting the ratio of B/A according to the present invention at 75% or less can further narrow the frequency band varying with temperature, providing a surface acoustic wave device inexpensive and excellent in performance.

An LT single crystal wafer with an orientation of around 36° Y-cut also provides the same effect. The LT single crystal wafer with an orientation of around 36° Y-cut is approximately −32 ppm/° K. in TCD. In this case, the frequency band varying with temperature is nearly 6.8 MHz in the same temperature range as described above. Accordingly, setting the ratio of B/A at 80% or less can suppress the frequency band varying with temperature to substantially 5 MHz. Thus, setting the ratio of B/A according to the present invention at 80% or less can further narrow the frequency band varying with temperature, providing a surface acoustic wave device inexpensive and excellent in performance.

Figure 6:
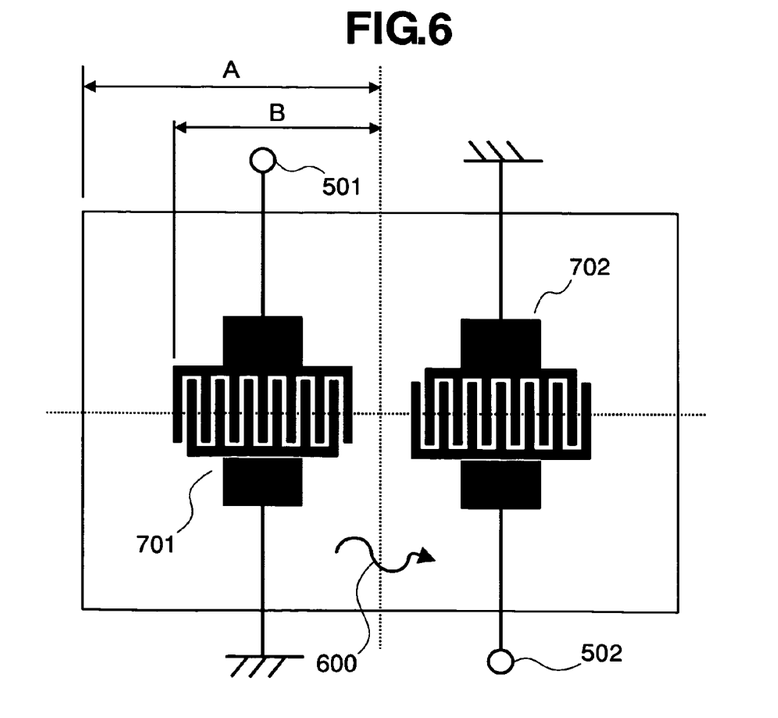
FIG. 6 is a top view of a bandpass surface acoustic wave device related to another embodiment.

While the above present embodiment describes the surface acoustic wave device formed by combining the resonators therewith, even a passband surface acoustic wave device shown in FIG. 6 or a multi-stage surface acoustic wave device combining a plurality of passband surface acoustic wave devices therewith can provide the same effect. In FIG. 6, an input signal is inputted into the input terminal 501, the surface acoustic wave 600 is excited by an input IDT 701, propagates to an output IDT 702, transformed again to an electric signal therein, and sent to the following circuit from the output terminal 502. Then, the signal is arranged to the desired frequency characteristic at this process. Also in the surface acoustic wave device with this configuration, setting the ratio of B/A at 70% or less can further narrow the frequency band varying with temperature, providing a surface acoustic wave device inexpensive and excellent in performance.

The effect of the present invention is to stabilize the frequency characteristic by suppressing not only a frequency variation with mere change in temperature but also a variation vertical to the direction to which a surface acoustic wave device propagates to keep a state as optimal as possible. Keeping the initial shape of the above IDT electrodes as best as possible makes it possible to use a surface acoustic wave discharging a small bulk wave in as best condition as possible, which can provide the surface acoustic wave small in propagation loss, that is, the surface acoustic wave device small in loss.

While the LT substrate as the first substrate is described in the above embodiment, the LN substrate also provides the same effect. Furthermore, while the Si substrate as the second substrate is described in the above embodiment, a glass substrate or a sapphire substrate also provides the same effect.

It is preferable that the first substrate is 20 μm to 70 μm thick. The reason is that a thickness of 20 μm or less makes manufacturing difficult, lowering a yield of the substrate, leading to increase in cost and, on the other hand, a thickness of 70 μm or more weakens the suppression effect of TCD by the second substrate. A single crystal piezoelectric substrate currently used in a surface acoustic wave device is 150 μm to 350 μm in thickness. Even if the single crystal piezoelectric substrate with these thicknesses is directly joined to the second substrate, the distance is longer between the surface of the first substrate on which the IDT electrode is formed and the surface of the second substrate, which does not provide the thermal expansion and the suppression effect of TCD. It is preferable that the first substrate is substantially 50 μm thick in the above range in terms of both workability and the suppression effect of TCD.

It is preferable that the second substrate is 100 μm to 350 μm thick. This is because a thickness of 100 μm or less weakens the suppression effect of TCD, on the other hand, a thickness of 350 μm or more increases the height of the surface acoustic wave device, retrogressing to trends in a decrease in thickness, leading to degradation in commercial value.

The LT substrate preferably ranges from 30° Y cut to 45° Y cut in orientation. The LN substrate preferably ranges from 40° Y cut to 65° Y cut in orientation. The reason is that a surface acoustic wave on both substrates travels comparatively faster and both substrates have comparatively larger electromechanical coupling coefficient in the above range.

When the Si substrate is used as the second substrate, its resistivity is preferably 1000 Ωcm or more. This is because an earth capacitance generated between the IDT for a surface acoustic wave device or wiring pattern connected therewith and ground is minimized as much as possible.

The adhesive for joining the first substrate to the second substrate is preferably 10 μm or less in thickness. The reason is that a thick adhesive makes it difficult to uniformly apply it and decreases the suppression effect of TCD by the second substrate as well.

It is desirable to use an ultraviolet hardened adhesive as an adhesive for joining the first substrate to the second substrate. This is because the ultraviolet hardened adhesive scarcely needs heat to harden the adhesive, making a warp as small as possible generated when substances different in thermal expansion coefficient are joined to each other.

A roughness Ra on the surface 101 of the first substrate joined to the second substrate, expressed as is the case with that on the surface 102 of the first substrate on which surface acoustic wave resonators are formed, is preferably 0.1 nm<Ra<0.5 nm.

As stated above, the use of the surface acoustic wave device according to the present embodiment provides a mobile communication terminal having a characteristic stable for temperature. The mobile communication terminal is equipped with for example a receiving section for receive a signal, a surface acoustic wave device described in the above embodiment for filtering the signal received by the receiving section, a demodulating section for demodulating the signal filtered by the surface acoustic wave device and an outputting section for outputting the signal demodulated by the demodulating section.

Figure 8:
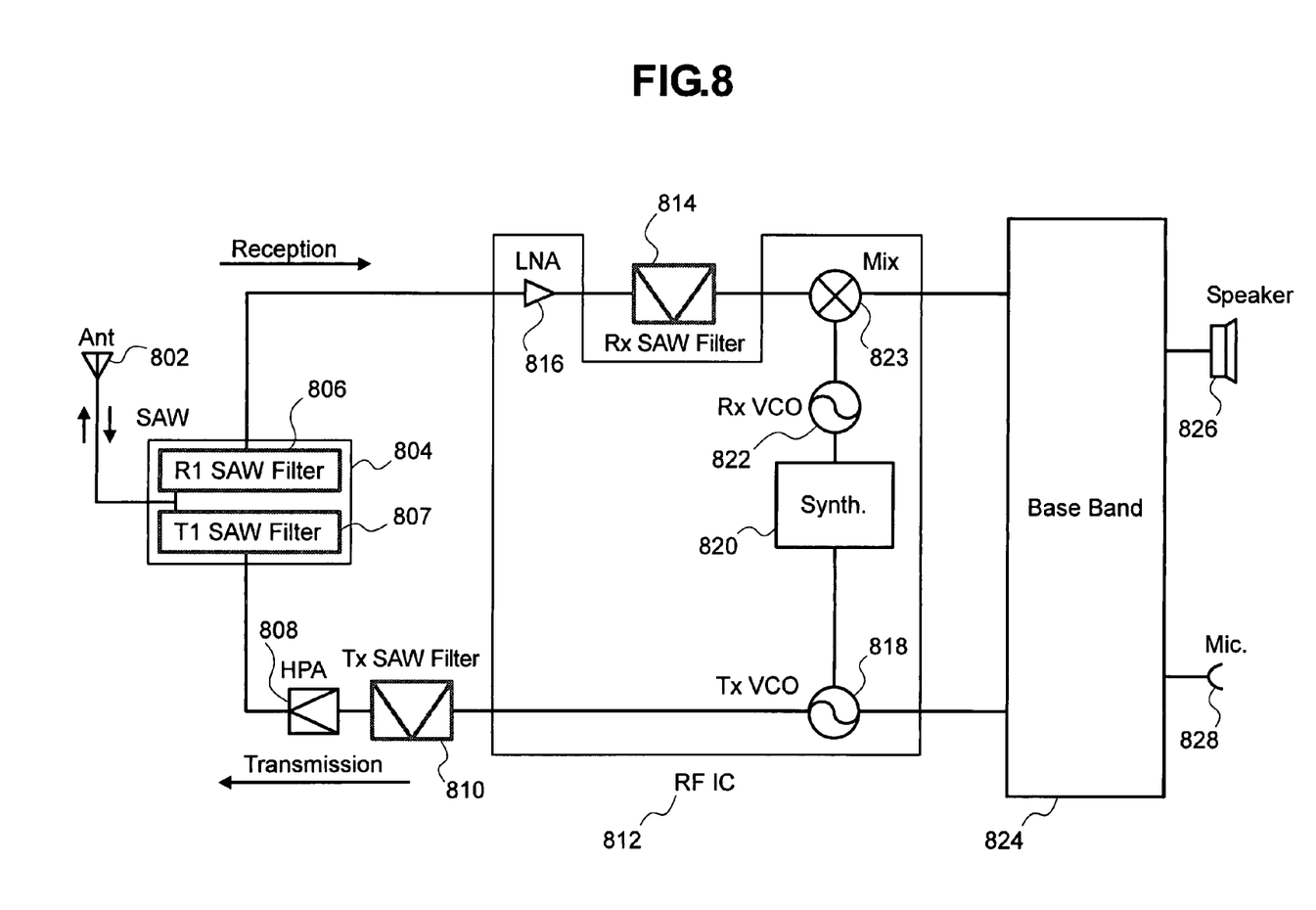
FIG. 8 is a schematic diagram of a mobile communication terminal using the surface acoustic wave device related to the present invention.

FIG. 8 shows a block diagram as one example of a mobile communication terminal equipped with the surface acoustic wave device according to the present invention. A mobile communication terminal 800 has an antenna 802, SAW duplexer 804, HPA 808, second transmission SAW filter 810, RF IC 812, second reception SAW filter 814, baseband 824, loudspeaker 826, and microphone 828. The RF IC 812 is provided with a transmission VCO (Tx-VCO) 818, synthesizer (Synth) 820, reception VCO (Rx-VCO) 822, low noise amplifier (LNA) 816, and mixing section (Mix) 823. The SAW duplexer 804 includes a first reception SAW filter 806 and first transmission SAW filter 807. The synthesizer 820 is capable of generating a stable frequency signal and operated using for example a crystal oscillator as source oscillation. The transmission and the reception VCO are oscillators for changing an oscillation frequency by an applied voltage.

In FIG. 8, the antenna 802 functions as the above receiving section. The second reception SAW filter 814 filters the signal received by the antenna and the RF IC 812 acts as a demodulating section for demodulating the filtered signal. In the mobile communication terminal 800 shown in FIG. 8, the antenna 802 functions as a transmitting and receiving section for transmitting and receiving a signal. The RF IC 812 functions as a modulating and demodulating section for demodulating the filtered signal and modulating an audio signal inputted from the microphone.

In the mobile communication terminal 800 shown in FIG. 8, the surface acoustic wave device according to the present invention can be applied to at least one of the second transmission SAW filter 810, the second reception SAW filter 814, the first reception SAW filter 806 in the SAW duplexer 804, and the first transmission SAW filter 807.

The receiving path of the mobile communication terminal 800 is described. The signal inputted from the antenna 802 is branched in the SAW duplexer 806, outputted from the first reception SAW filter 806 in the SAW duplexer 804 to the LNA 816 in the RF IC 812, and amplified therein. The signal amplified by the LNA 816 is shaped by the second reception SAW filter 814, transformed to a lower frequency in the mixing section 823, outputted to the baseband 824. The signal outputted from the baseband 824 is sent to the loudspeaker 826 and outputted as speech.

In the next place, the transmitting path of the mobile communication terminal 800 is described. A speech signal inputted from the microphone 828 is sent from the baseband 824 to the Tx-VCO 818 and modulated therein. The signal modulated in the Tx-VCO 818 is shaped in the second transmission SAW filter 810 and then amplified in the HPA 808. The signal amplified by the HPA 808 is sent to the antenna 802 via the first transmission SAW filter in the SAW duplexer 804 and transmitted from the antenna 802.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A surface acoustic wave device comprising:
   a piezoelectric substrate;
   a supporting substrate being joined to the piezoelectric substrate and including a material different in expansion coefficient from the piezoelectric substrate; and
   an interdigital electrode for exciting a surface acoustic wave, the electrode being arranged on the surface of the piezoelectric substrate;
   wherein the interdigital electrode is 40% or more to 70% or less as long as the piezoelectric substrate in a direction to which a surface acoustic wave propagates.

2. The surface acoustic wave device according to claim 1, wherein the piezoelectric substrate is a single crystal piezoelectric substrate made of lithium niobate or lithium tantalite.

3. The surface acoustic wave device according to claim 2, wherein the piezoelectric substrate is a single crystal piezoelectric substrate made of lithium tantalite with an orientation of 30° to 45° Y cut.

4. The surface acoustic wave device according to claim 2, wherein the piezoelectric substrate is a single crystal piezoelectric substrate made of lithium niobate with an orientation of 40° to 65° Y cut.

5. The surface acoustic wave device according to claim 1, wherein the supporting substrate is made of glass, sapphire, or silicon.

6. The surface acoustic wave device according to claim 5, wherein the supporting substrate is made of silicon with a resistivity of 1000 Ωcm or higher.

7. The surface acoustic wave device according to claim 1, wherein the piezoelectric substrate is 20 μm to 70 μm in thickness.

8. The surface acoustic wave device according to claim 1, wherein the piezoelectric substrate is joined to the supporting substrate by using an ultraviolet hardened adhesive.

9. The surface acoustic wave device according to claim 8, wherein the ultraviolet hardened adhesive is 10 μm or less in thickness between the piezoelectric substrate and the supporting substrate.

10. The surface acoustic wave device according to claim 1, wherein the surface of the piezoelectric substrate to which the supporting surface is joined is mirror polished to such a degree that an Ra expressing roughness is more than 0.1 nm and less than 0.5 nm.

11. The surface acoustic wave device according to claim 1, wherein the interdigital electrode is a single continuous interdigital electrode having a dimension extending in the direction to which the surface wave propagates which is 40% to 70% as long as a dimension extending in the direction to which the surface wave propagates of an entirety of the piezoelectric substrate on which the interdigital electrode is arranged.

12. A surface acoustic wave device comprising:
   a first substrate being a single crystal piezoelectric substrate;
   a second substrate joined to the first substrate; and
   an interdigital electrode for exciting a surface acoustic wave, the electrode being provided on the surface of the first substrate opposite to the surface joined to the second substrate;

wherein a surface acoustic wave resonator composed of the interdigital electrode is 40% or more to 70% or less as long as the surface acoustic wave device in the direction to which a surface acoustic wave propagates, so as to enable suppress deformation of the first substrate.

13. The surface acoustic wave device according to claim 12, wherein the interdigital electrode is a single continuous interdigital electrode having a dimension extending in the direction to which the surface wave propagates which is 40% to 70% as long as a dimension extending in the direction to which the surface wave propagates of the surface acoustic wave device.

14. A communication terminal comprising;
a duplexer for branching a transmitted and a received signal;
a first surface acoustic wave device for filtering the received signal;
a modem section for demodulating a signal filtered by the first surface acoustic wave device and modulating a speech signal; and
a second surface acoustic wave device for filtering the speech signal modulated and demodulated by the modem section;
wherein the first and the second surface acoustic wave device comprises:
a piezoelectric substrate;
a supporting substrate being joined to the piezoelectric substrate and including a material different in expansion coefficient from the piezoelectric substrate; and
an interdigital electrode for exciting a surface acoustic wave, the electrode being arranged on the surface of the piezoelectric substrate;
wherein the interdigital electrode is 40% or more to 70% or less as long as the piezoelectric substrate in a direction to which a surface acoustic wave propagates.

15. The communication terminal according to claim 14, wherein the piezoelectric substrate is a single crystal piezoelectric substrate made of lithium niobate or lithium tantalite.

16. The communication terminal according to claim 15, wherein the piezoelectric substrate is a single crystal piezoelectric substrate made of lithium tantalite with an orientation of 30° to 45° Y cut or of lithium niobate with an orientation of 40° to 65° Y cut.

17. The communication terminal according to claim 14, wherein the supporting substrate is made of glass, sapphire, or silicon.

18. The communication terminal according to claim 17, wherein the supporting substrate is made of silicon with a resistivity of 1000 Ωcm or higher.

19. The communication terminal according to claim 14, wherein the piezoelectric substrate is 20 μm to 70 μm in thickness.

20. The communication terminal according to claim 14, wherein the piezoelectric substrate is joined to the supporting substrate by using an ultraviolet hardened adhesive.

21. The communication terminal according to claim 20, wherein the ultraviolet hardened adhesive is 10 μm or less in thickness between the piezoelectric substrate and the supporting substrate.

22. The communication terminal according to claim 14, wherein the surface of the piezoelectric substrate to which the supporting surface is joined is mirror polished to such a degree that an Ra expressing roughness is more than 0.1 nm and less than 0.5 nm.

23. The surface acoustic wave device according to claim 14, wherein the interdigital electrode is a single continuous interdigital electrode having a dimension extending in the direction to which the surface wave propagates which is 40% to 70% as long as a dimension extending in the direction to which the surface wave propagates of an entirety of the piezoelectric substrate on which the interdigital electrode is arranged.

* * * * *